United States Patent [19]
Conan

[11] Patent Number: 5,504,712
[45] Date of Patent: Apr. 2, 1996

[54] REDUNDANCY CIRCUIT FOR MEMORY

[75] Inventor: Bertrand Conan, Aix En Provence, France

[73] Assignee: SGS-Thompson Microelectronics S.A., Gentilly, France

[21] Appl. No.: 97,598

[22] Filed: Jul. 23, 1993

Related U.S. Application Data

[63] Continuation of Ser. No. 625,846, Dec. 11, 1990, abandoned.

[30] Foreign Application Priority Data

Dec. 11, 1989 [FR] France ................... 89 16338

[51] Int. Cl.$^6$ .................................... G11C 29/00
[52] U.S. Cl. .................. 365/200; 365/189.07; 371/10.3
[58] Field of Search ......................... 365/200, 189.07, 365/230.01, 230.03; 371/10.3, 10.1

[56] References Cited

U.S. PATENT DOCUMENTS

| | | | |
|---|---|---|---|
| 4,601,019 | 7/1986 | Shah et al. ................... | 365/200 |
| 5,107,464 | 4/1992 | Sahara et al. ................. | 365/200 |
| 5,140,597 | 8/1992 | Araki ........................... | 365/200 X |

FOREIGN PATENT DOCUMENTS

| | | |
|---|---|---|
| 0104120 | 3/1984 | European Pat. Off. . |
| 2611301 | 8/1988 | France . |
| 9003033 | 3/1990 | WIPO . |

OTHER PUBLICATIONS

Nishimura et al, "A Redundancy Test–Time Reduction Technique in 1–Mbit DRAM with a Multibit Test Mode", *IEEE Journal of Solid–State Circuits*, vol. 24, No. 1, Feb. 1989, pp. 43–49, IEEE, New York, USA.

*Primary Examiner*—Do Hyun Yoo
*Attorney, Agent, or Firm*—Robert Groover; Betty Formby

[57] ABSTRACT

Memories in integrated circuit form can have several amplifiers per data contact. To increase the possibilities of redundancy with a given number of redundancy columns without, causing too much space near the memory zone to be occupied by complicated multiplexers, the address AP used to select a single amplifier for each contact is used also to select one group of memories among several groups (as many groups as there are amplifiers per contact) in a defective address storage register. Only the defective addresses of this group are applied to a comparator used to detect whether a defective column address is received by the memory. A correlation is thus set up between the place where the defective column is located and the place where the redundancy column, which will be used to replace it, is located. This correlation results from the simultaneous selection by AP of a group of amplifiers and of a group of defective column addresses connected to these amplifiers.

26 Claims, 4 Drawing Sheets

REDUNDANCY CIRCUIT FOR MEMORY

This is a continuation of application Ser. No. 07/625,846, filed Dec. 11, 1990, now abandoned.

BACKGROUND OF THE INVENTION

The invention relates to memories made in integrated circuit form and, more particularly, circuits for the activation of redundant columns.

The greater the storage capacity of a memory, and the more precision-oriented its integration technology, the more these memories are subject to manufacturing defects. For it is very difficult to obtain, simultaneously, a very small-sized integrated circuit, a very large storage capacity within this small size and high manufacturing efficiency. Just one defect in a memory with a million cells may mean that the memory has to be discarded.

To increase manufacturing efficiency, it is common to use memories having redundancy systems, namely memories having more memory cells than are needed and connection circuits capable of using the additional cells (redundant cells) and require normal cells which turn out to be defective. When the memory is tested, the defective cells are detected and connection paths are set up to disconnect the defective cells and connect the redundant cells in their place, so that the user sees the memory as being good on the whole despite the presence of defective elements.

In principle, memories are organise in rows and columns of cells. At a column conductor (sometimes called a "bit line"), the user reads the information contained in a cell located at the intersection of this column conductor with a determined row defined by a row address.

The redundancy systems commonly used generally do not merely replaced a defective cell by a redundant cell. More usually, they replace a row or a column having one or more defects by a redundant row or column.

In large-capacity memories designed to give data in the form of z-bit words, the number of columns is typically far greater than z. For example, even if 8-bit, 16-bit or 32-bit words are to be given at the output of the memory, the total number of columns may be 512. In this case, the columns are arranged in z sets of columns, each set corresponding to a data output contact of the memory. At each contact and in each reading operation, there is collected a piece of data coming from a determined column of a set corresponding to this contact and not to another one. There are z contacts and z sets: one contact per set.

It will be noted, in passing, that throughout the rest of this description, we shall consider only the aspect of the reading of data contained in the memory. However, it is clear that if the memory is an electrically recordable memory (RAM or EPROM or EEPROM), the contacts are also used to introduce data into the memory cells for writing. Since this in no way changes the problem of redundancy, we shall refer hereinafter to reading only, to prevent the description from becoming too cumbersome. Should it become necessary to take account of the writing operation as well, it will suffice to add on the elements necessary for writing and, especially, writing amplifiers connected between the contacts and the sets of columns.

In simpler embodiments, a single data reading amplifier corresponds to each contact.

FIG. 1 gives a very schematic view of a memory of this type. The memory is organised in z-bit words. There are z output contacts (P0 to P3), z reading amplifiers (A0 to A3), and z sets of columns each corresponding to a respective amplifier and contact. Each set has p columns of cells, and each column has n cells, i.e. the memory has n rows of cells.

There is a line (row) decoder DL designed to receive a line (row) address AL and select to one among n rows as a function of this address. There is a column decoder DC designed to receive a column address AC and to select one among p columns as a function of this address. The selection of a column address designates not just a single column but one column in each of the z sets, and connects this column to the reading amplifier and hence to the corresponding output contact. The application of a line address and a column address therefore sets up a z-bit word, coming from z columns, at the outputs. These z columns are distributed among the z sets: they all occupy the same column order number (among p possible column order numbers) in the different sets. The column address actually designates one determined column order number among p, for all the sets simultaneously.

The memory may include redundant rows (not shown for in this invention we are concerned purely with column redundancy) and redundant columns. For example, one group of redundant columns is provided for each of the z sets. The groups of redundant columns, given the general references CR0 to CR3, are controlled by a redundancy activation circuit CAR. This circuit receives the column addresses AC, checks whether they correspond to a defective column address and, if this is the case, deactivates the column decoder DC and selects a redundancy column as a replacement.

Since there is little space available in the memory, it is commonly seen, in practice, that the selection circuit designates one redundancy column simultaneously in each of the groups CR0 to CR3 (just as the column decoder DC simultaneously selects one column of each set). However, this means that, when a column is defective in a particular set, not only this column but all the columns having the same column address and forming part of the other sets are replaced. Provision could be made for another organisation of redundancy, wherein only the defective column is replaced, but this would imply the use of additional and fairly complicated routing or branching logic circuits for which there is generally no place in the integrated circuit (since such circuits take up a great deal of space in the immediate periphery of the array of memory cells.

The analogous organisation of the column redundancy may be more complicated in differently organised memories, especially memories which, by virtue of their high storage capacity and their integration density, have several reading amplifiers (2 or 4 or even more) per data contact. One address bit (or two or more) is reserved for the selection of the reading amplifier. The set of columns associated with each contact is now divided into several groups, each corresponding to a respective reading amplifier.

A memory such as this is shown in FIG. 2. The organisation of the rows and the line decoder are not shown, since only the layout of the columns concerns the column redundancy.

There are z sets of columns, designated by E0 to E3(z=3 in this example), each corresponding to a respective contact P0 to P3. Each set includes k groups (here k=2) and each group (within a set) is connected through its own respective amplifier to the contact that is associated with the set. The groups are designated by G0a and G0b for the first set E0, and by G1a and G1b for the second set E1, etc. The amplifiers are designated by A0a and A0b for the first set E0, and by A1a and A1b for the second set E etc.

Each group (G0a, G0b, G1a, etc) has p columns. The numbers of the p columns within a group will be referred to by their column order number (0 through p-1). The application of a word to the z outputs of the memory is done by the selection of a line address AL, a column address AC (specifying the column order number) and a post-selection address (corresponding to a "group order number"). The line address AL designates a row of cells. The column address AC designates one the p columns in each of the groups in each set i.e. k times z columns in all, the thus designated columns all having the same column order number among p column order numbers. Finally, the post-selection address AP defines one among k amplifiers in each set or, in what amounts to the same thing, one group order number of the k group order numbers. The consequence of this is the selection of one among k amplifiers in each set, i.e. a total of z amplifiers all having the same group order number among order numbers. The item sent to the data contacts will be a z-bit word coming from columns all having the same column order number (defined by AC) in the groups to which they belong, the groups themselves all having the same group order number (defined by AP) in the sets to which they belong.

FIG. 2 shows how the selection of columns and the post-selection are done from the address of a word that includes (in addition to the line address AL) the two address parts AC and AP.

Associated with each group of columns G0a, G0b to G3a, G3b, there is provision for a respective group of redundancy columns CR0a, CR0b to CR3a, CR3b.

Each group of redundancy columns includes r columns which means that, with one group, it is possible, in principle, to repair r defective columns. However, as shall be seen, the architecture does not make it possible to repair a total number of columns equal to z times k times r (z•k•r) although there are z times k times r redundancy columns. Indeed, for the same reasons as those indicated with reference to FIG. 1, the redundancy column selection circuit will select one among r columns simultaneously in all the groups, so that r defective columns will be repaired at the most. In the example shown, r=2: there are two redundancy columns in each of the two groups of each of the four sets.

FIG. 2 indicates the overall constitution of the redundancy column selection circuit: it has a comparator (COMP) receiving the column address AC and comparing this address with addresses stored in a register for storing addresses of defective columns (RS). If there is coincidence, the comparator deactivates the column decoder DC to prevent it from selecting the deactivated column and activates a redundant column selection circuit CSR. Depending on the result of the comparison, this circuit CSR selects one of the r redundancy columns of each set, simultaneously for all the sets. It is therefore all the redundancy columns of a given redundancy order number (among r possible redundancy order numbers) of the various groups CR0a, CR0b to CR3a, CR3b that are selected.

In this architecture, the address storage register RS has a maximum of r memories, each making it possible to store the address of one among p columns. The effectively stored address is the column address AC of a defective column, independently of the group to which it belongs. All the columns having a same column address AC are replaced by redundancy columns having the same order number among r order numbers. There are z•k replacements for each defective column.

There are several approaches to increasing the possibilities of replacement of defective columns, this increase being desirable when the size of the memory increases:

the first approach obviously consists in increasing r, but this greatly increases the size of the memory since there are r times k times z redundant columns. Furthermore, this entails a risk as the redundant columns themselves may be defective.

the second approach consists in making the redundancy selection circuit capable of selecting any redundancy column without distinction and of routing it towards any amplifier whatsoever, without having to select one column simultaneously in every group. But this approach uses many routing or branching circuits, precisely at places close to the column outputs where there is not a great deal of space.

a third possible approach is shown in FIG. 3. It consists in using a selection circuit CSR which separately controls the redundancy columns of the k different groups. For each defective column, the selection circuit will designate one among the k•r columns in each set, and not merely one among the r columns in each group. Only redundancy columns which have the same column and group order number will be selected. To illustrate this, the second redundant column, for example, can be selected among the groups of redundant columns CR0a, CR1a, CR2a, CR3a but without also selecting the second redundant column of the other groups CR0b to CR3b. In FIG. 2, all the second redundancy columns of all the groups CR0a, CR0b to CR3a, CR3b are necessarily selected. Hence, generally speaking, the advantage of the structure of FIG. 3 over that of FIG. 2 is that, the possibilities of redundancy are multiplied by k without any increase in the total number of redundant columns. However there are also disadvantages it is difficult to design such memories, because of the scarcity of space available in the immediate vicinity of the network of cells and decoders. The comparator and the selection circuit CSR are more complicated, and it is necessary to have at least k times r output lines for the circuit CSR instead of r lines only.

SUMMARY OF THE INVENTION

The present invention is aimed at proposing a redundancy activation circuit which enables an increase in the possibilities of repairing a memory of the type shown in FIG. 2, having several amplifiers per data contact. The improvement is of the same order as the one obtained in FIG. 3 as compared with FIG. 2, but it minimizes the problems of space factor by shifting the additional connections, designed to increase the possibilities of repair, towards the uncongested peripheral zones.

According to the invention, it is proposed essentially to use a defective address storage register RS having k groups of r memory zones wherein each zone can contain one column address. Each group of zones corresponds to one out of k group order numbers of amplifiers. Each group of r memory zones will be dedicated to the repairing of the columns of the group corresponding to an amplifier of a given order number and will not be able to repair the columns corresponding to the other amplifiers and to the other groups of columns that do not have the same group order number. The post-selection address AP used to designate the group order number of the amplifiers to be used and serving effectively to activate all the amplifiers of this group order number, will also be used to designate the group of defective address memories and to activate only the group with an order number corresponding to that of the activated amplifiers.

Consequently, the selection circuit CSR remains the same as in FIG. 2 and acts in the same way on the redundant columns, but the comparator is capable of being connected to k times r memory zones (and not merely r zones as in FIG. 2), and the post-selection address received by the memory designates one group among the k groups of memory zones so that this group is effectively connected to the comparator.

The possibilities of repair are as great as with the circuit of FIG. 3: r defective columns located in groups of the same order number among k order numbers can be repaired independently, and this can be done for each of the order numbers.

By comparison, it will be noted that, in FIG. 3, the comparator is permanently connected to k times r memory zones and must give the selection circuit not only one among r numbers but also one among k group order numbers. Furthermore, the memory zones in the case of FIG. 3 must store both the column address AC and the post-selection address AP, and the comparator should provide a comparison on these two address portions. In the invention, the comparator is connected, at a given instant, to only r zones and not k times r zones, it designates one among r order numbers and, finally, it makes comparisons only on the column addresses AC. Besides, the circuit according to the invention enables the additional connections, made necessary by the increase in the number of possibilities of repair, to be shifted to the periphery of the memory (where the defective address storage registers are located). It does not make it necessary to place branching circuits where there would be no place for them, i.e. between the outputs of the columns and the amplifiers.

The following could be a detailed structural definition of the memory according to the invention:

A circuit for activating a redundancy column in an integrated memory with data column redundancy, the memory comprising:

a network of memory elements organised in n rows and z sets of k groups of p columns, where n, z, k and p are different from one, each set corresponding to a respective data contact among z contacts, and each group corresponding to a respective reading amplifier among k amplifiers connected to this contact, in such a way that a data item of a column of a given group in a given set is applied to the contact corresponding to this set by the amplifier corresponding to this group, a column decoder to select one among p columns simultaneously in all the groups of all the sets, and a post-selection means to select one among k amplifiers simultaneously in all the sets, as a function of the reception, by the memory, of one address AC among p column addresses, and of one group address AP among k, this group address defining one group order number in each set, wherein said redundant column activation circuit comprises:

r redundancy columns per group in each of the sets, to replace at least one defective column in the network, r being greater than or equal to one, the r redundancy columns of a group being connected directly to the amplifier corresponding to this group, a redundancy column selection circuit CSR to select one among r redundancy columns simultaneously in all the groups of all the sets, i.e. to select simultaneously z•k redundancy columns of the same order number (1 among r) all belonging to different groups and sets;

k groups of memories for storing defective column addresses, each memory group having r column addresses in memory, and each address enabling one among p columns to be designated, each group of memories being dedicated to the storage of defective column addresses corresponding to a single order number of group of columns among k, without any distinction between the sets to which the defective columns may belong (that is, the first group of memories corresponds to a defective column address belonging to the first group of any one of the sets whatsoever, the second group of memories corresponds to a column address belonging to the second group of columns of any set whatsoever, etc.), a memory group selection means, capable of selecting one among k groups of memories during the reception, by the memory, of one among k group addresses, a means to compare one among p column addresses, received by the memory, with all the addresses of a selected group of memories and, on the one hand, to inhibit the column decoder (but not the post-selection means) and, on the other hand, to command the selection, by the redundancy column selection circuit, of a redundancy column determined as a function of the result of the comparison.

BRIEF DESCRIPTION OF THE DRAWINGS

Other features and advantages of the invention will emerge from the following detailed description, made with reference to the appended drawings, wherein.

Figure 1:
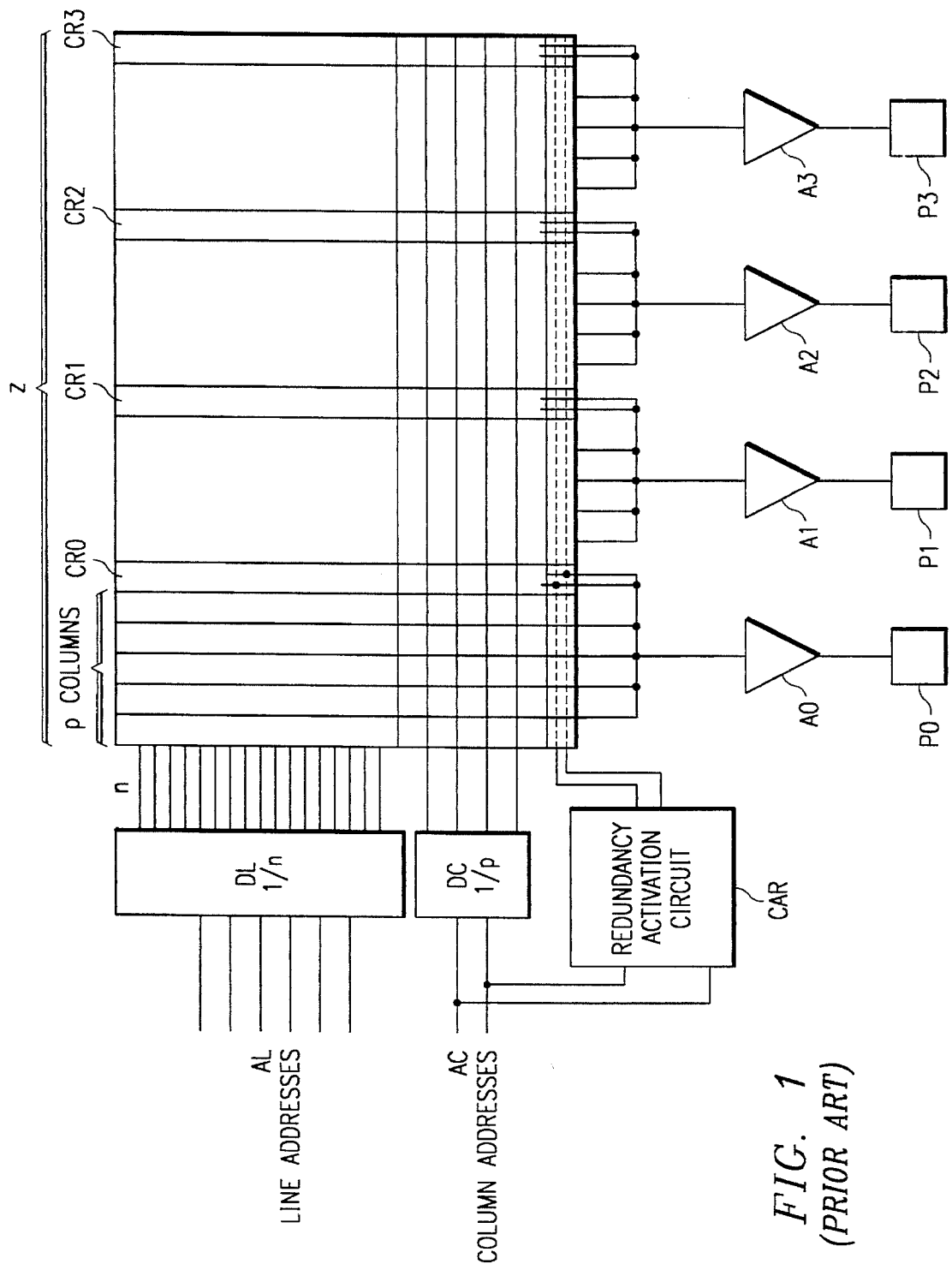
FIGS. 1 to 3, already described, represent structures of memories and of redundancy systems having imperfections.
Figure 2:
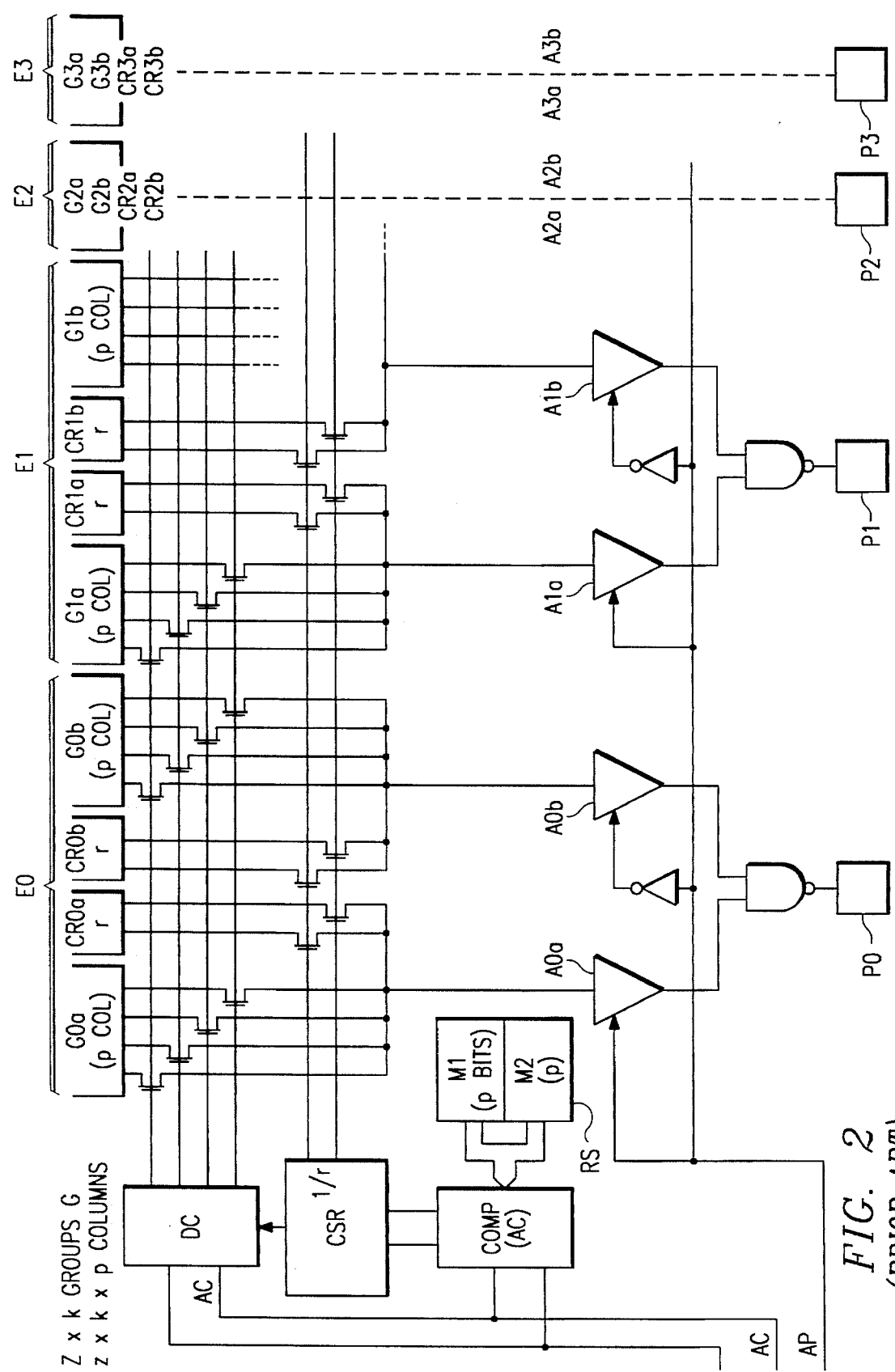
Figure 3:
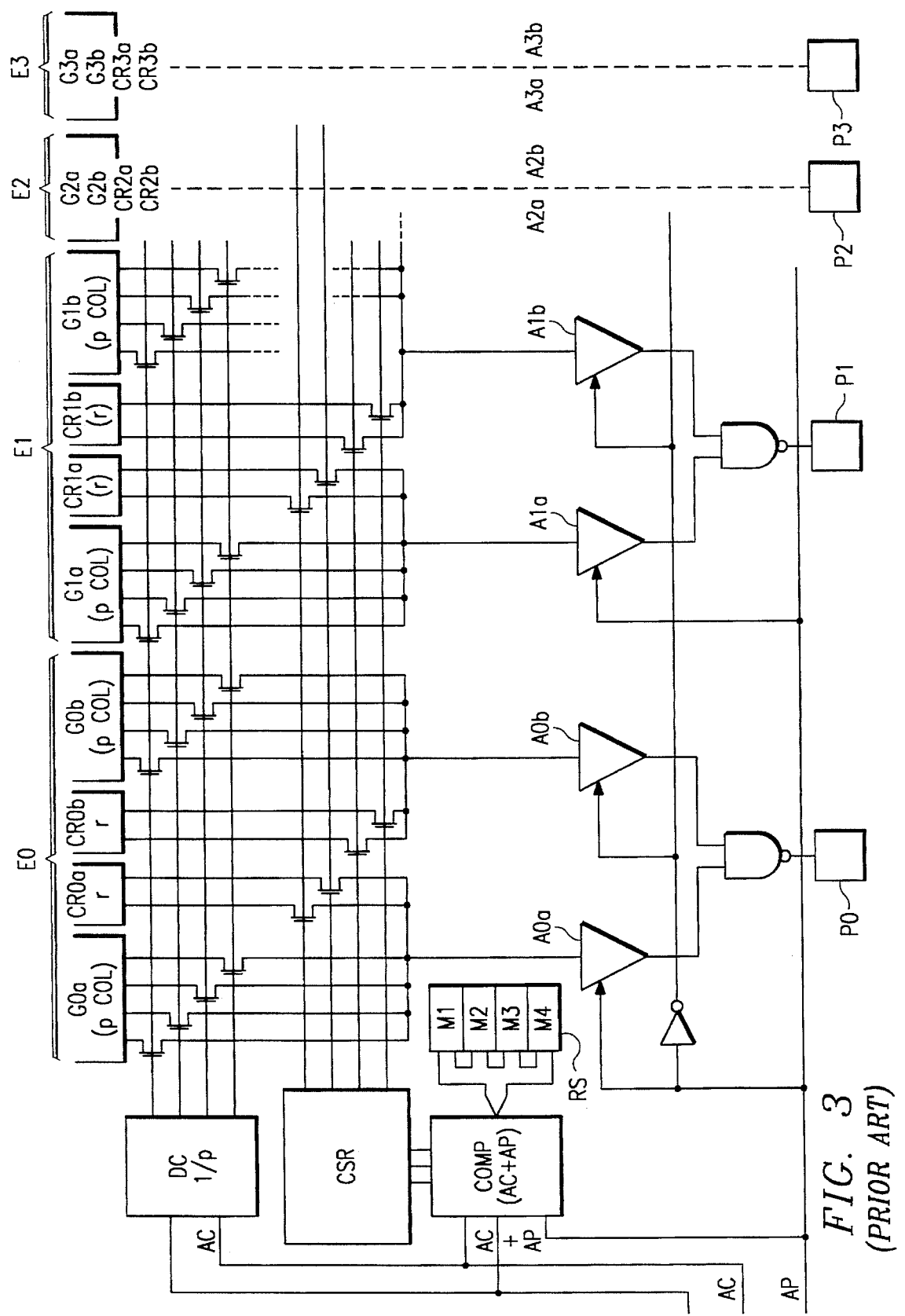
Figure 4:
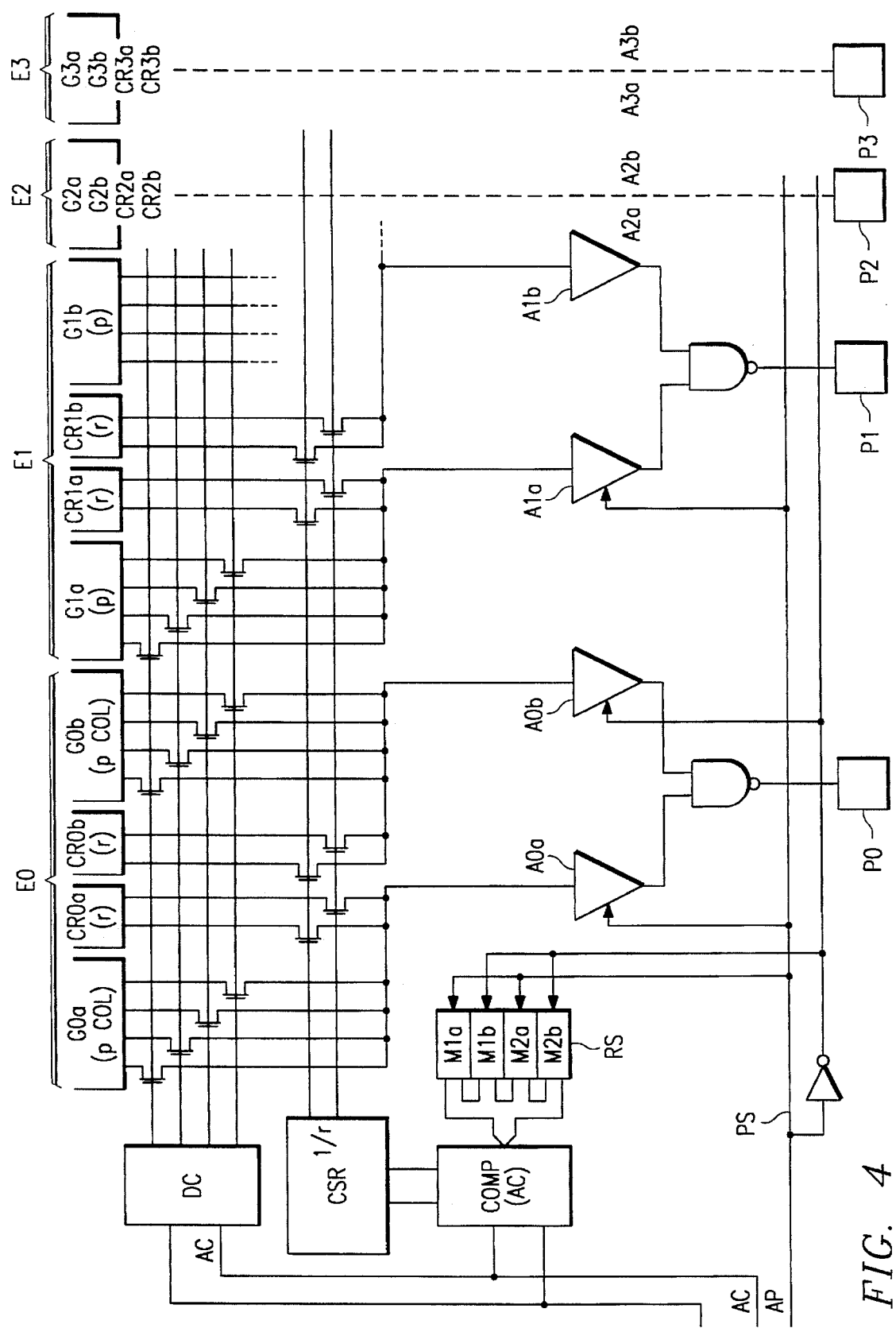
FIG. 4 shows a schematic diagram of a redundancy system according to the invention.

The general matrix arrangement of FIG. 4 shall not be described in detail as it is the same as the one described with reference to FIGS. 2 and 3. However note that the architecture of CSR and its outputs (and the associated select transistors) are different from FIG. 3, as are the comparator COMP and register RS.

DESCRIPTION OF A PREFERRED EMBODIMENT

There are z sets E0, E1, . . . of k groups G0a, G0b of p columns of memory cells in a main network, and z sets of k groups CR0a, CR0b of r redundancy columns, each group (CR0a) of redundancy columns corresponding to a group (G0a) of columns of memory cells of the main network. Furthermore, each group G0a corresponds to an amplifier A0a, and the different amplifiers (A0a, A0b) corresponding to the same set (E0) are connected to the same data output contact (P0). There are therefore z output contacts (P0 to P3 in FIG. 4. The amplifiers of the first set are A0a and A0b corresponding to the groups G0a and G0b respectively, A1a and A1b corresponding to the groups G1a and G1b, etc.

The column order number, among p possible order numbers within a group, is defined by a column address AC. The group order number of the group or of the amplifier among k possible group order numbers within a set is defined by a post-selection address AP.

The column address A0 selects all of the k•x columns, with the same column order number, of all the groups. It performs this selection by means of a multiplexer placed at the output of the columns. The post-selection address AP selects all the groups with same group order number in all the sets simultaneously. This post-selection is done by activating all the amplifiers of one same group number (1 among k group order numbers) of the different sets. The activation of an amplifier connects the columns of the group, corresponding to this amplifier (and, more precisely, the column selected within this group by the column address AC), to the contact of the set in which the group is located, i.e. the contact to which this particular amplifier is connected.

The redundancy column may be selected by means of a redundancy circuit essentially including a comparator COMP capable of comparing the column address AC received by the memory with defective column addresses memorised in a storage register RS. When a defective address is applied to the memory, it is recognised by the comparator, which then has the function of inhibiting the column decoder DC and selecting a redundancy column to replace the defective column.

Each of the groups of redundancy columns is associated with an amplifier and is connected to this amplifier by means of a multiplexer in the same way as the columns of memory cells of the main network are connected to the amplifiers by means of a multiplexer. However, while the linking of the columns of the main network is controlled by the decoder DC, the linking of the redundant columns is controlled by a redundant column selection circuit CSR coupled to the output of the comparator COMP.

The storage register RS comprises k groups of r memory zones, each zone being capable of memorising a column address defining one defective column among p columns. The group in which this column is located is neither identified nor memorised in the memory zone of the storage register. However, if 1 among k group order numbers is defined for each group of r zones, as 1 among k group order numbers was defined for the groups of columns of the network and for the amplifiers, each group of r memory zones of a determined group order number is designed to store only one defective column address located in a group of columns of this very same group order number.

Thus, in the example shown, the register RS includes two groups (k=2) of memory zones, because there are two amplifiers per contact. The first group includes two zones (r=2) designated by M1a and M2a designed to store defective column addresses only if these columns are located in the first order number groups G0a, G1a, G2a, G3a. Two defective addresses may be stored for two repairs. The second group includes two other zones M1b and M2b to store defective column addresses located in the second order numbers groups G0b to G3b only.

The register RS is controlled by the post-selection address AP, which defines precisely the 1 among k group order numbers of groups and amplifiers which will serve, according to the invention, to define also the 1 among k group order numbers of the group of storage memories of the register RS. Under the command of a bus PS sending the post-selection address AP, the register RS gives the comparator COMP only the contents whose the memory zones of group order number corresponds to this address AP. In this group, there are r memory zones, namely r possibilities of storing defective column addresses. If one of them corresponds precisely to the column address AC received at the input of the memory, the comparator reports this fact and tells the selection circuit CSR which memory is the one at which the detection has been made.

Then, under the command of the comparator, the selection circuit CSR is capable of defining one among r redundancy columns, simultaneously for all the groups of r columns of all the sets. It does not distinguish between one group and another or between one set and another: this enables the size of the multiplexer that it commands to be reduced to the minimum (to the same size as in FIG. 2). Naturally, it will have been understood that the designated redundancy column (among r redundancy columns) is the one corresponding to the memory (among r memories) that contains the defective address recognised by the comparator.

During the detection of a defective address, one column among r redundancy columns is therefore selected in each of the groups, irrespectively of their group order numbers among k order number, and it is connected to the input of the amplifier corresponding to this group. However only the activated amplifiers will effectively transmit the information towards a contact, and only the amplifiers of one determined group order number among k order numbers are activated, as a function of the post-selection address AP. Now, the detection of defective addresses has been permitted only for the columns corresponding to the same group order number among k group order numbers. The result thereof is that even if the selection circuit CSR does not distinguish between the order numbers of the groups, the entire system makes this distinction and indirectly establishes a correlation between the order number, among k order number, of the group that includes a defective column and the order number, among k order numbers, of the redundancy column which will serve to replace the defective column.

We have thus achieved the aim of the invention which is to increase the possibilities of redundancy without increasing the amount of space occupied in the immediate vicinity of the columns of the memory. In particular, the size of the multiplexer which, under the control of the circuit CSR, designates one among r columns, is reduced to the minimum and the additional, added-on elements, such as the additional memory zones of the register, are shifted towards the periphery.

It will be noted that these memory zones may be formed by batteries of fuses, or by electrically programmable memory cells such as EPROM or EEPROM cells.

What is claimed is:

1. A memory in integrated circuit, comprising:

a plurality of externally accessible data output contacts numbering z;

a network of memory elements organized into a plurality of groups of memory columns, each said group having one of k group order numbers associated therewith, and each said group also including at least one redundancy column;

a plurality of amplifiers, numbering k, connected to each said data output contact, each said amplifier having a group order number between 1 and k inclusive associated therewith which is the same as the one of said group order numbers associated with the ones of said columns to which said amplifier is connected;

a defective memory column address storage register comprising k groups of memory zones, each said group of memory zones corresponding to a respective one of said k group order numbers; and post-selection circuitry for simultaneously selecting, in accordance with an externally received group order number which is between 1 and k inclusive, all the ones of said amplifiers which correspond to said externally received group order number; wherein said post-selection circuitry also selects, in said storage register, the group of memory zones which corresponds to said externally received group order number; and a comparison circuit configured and connected to compare each memory column address received by the memory with column addresses in the selected group of memory zones in said storage register;

whereby said comparison circuit compares only defective memory column addresses stored in the memory zones of the selected group with the memory column address.

2. A memory according to claim 1, wherein the number of said externally accessible data output contacts is z, wherein said network of memory elements is organized into
a plurality of rows numbering n and
a plurality of sets numbering z, each including a plurality of k groups, each including a plurality of memory columns numbering p, where n, z, k and p are different from 1 and where z•k•p=number of memory columns,
each said set corresponding to a respective one of said z data output contacts, and
each said group of p memory columns corresponding to a respective one of said k amplifiers, which is connected to the respective one of said data output contacts in such a way that a bit of data from a selected one of said columns within a selected one of said groups in a determined set is applied to the data output contact corresponding to this set by the amplifier corresponding to this group, wherein said memory further comprises a column decoder to select one among p memory columns simultaneously in all said groups of all said sets, as a function of the reception, by the memory, of a selected one of p possible memory column addresses, wherein said network further comprises said redundancy columns numbering r per group in each of said sets, to replace at least one defective memory column in said network, r being greater than or equal to 1, said r redundancy columns of each said group being connected to a respective one of said amplifiers corresponding to this group, and further comprising a redundancy column selection circuit to select one among said r redundancy columns simultaneously in all said groups of all said sets;

wherein said storage register comprises said k groups of memory zones for storing defective memory column addresses, each said group of memory zones having r defective memory column addresses each enabling one among said p memory columns to be designated, each said group of memory zones being dedicated to the storage of defective memory column addresses corresponding to only one among said k group order numbers, without any distinction between the ones of said sets to which the defective memory columns may belong, said post-selection circuit being capable of selecting one among said k groups of memory zones during the reception, by the memory, of an externally received group address, and wherein said comparison circuit compares an externally received column address, of the p possible memory column addresses, with all the addresses stored in a selected group of said memory zones, and, if a match is detected, inhibits said column decoder (but not said post-selection circuit), and also commands the selection, by said redundancy column selection circuit, of a selected one of said redundancy columns determined as a result of the comparison.

3. A memory according to claim 1 wherein the number of said data output contacts is z, wherein said network of memory elements is organized into
a plurality of rows numbering n and
a plurality of sets numbering z, each including a plurality of groups numbering k, each including a plurality of memory columns numbering p, where n, z, k and p are different from 1,
each said set corresponding to a respective one of said z data output contacts, and
each said group of p memory columns corresponding to a respective one of said k amplifiers, which is connected to the respective one of said data output contacts in such a way that a bit of data from a selected one of said columns within a selected one of said groups in a determined set is applied to the data output contact corresponding to this set by the amplifier corresponding to this group.

4. A memory according to claim 3 wherein said memory further comprises a column decoder to select one among p memory columns simultaneously in all the groups of all the sets.

5. A memory according to claim 4 wherein said post-selection circuit selects one among said k amplifiers simultaneously in each of the sets, as a function of the reception, by the memory, of one group address among k group addresses, this group address defining a group order number in each set.

6. A memory according to claim 4, wherein said network further comprises redundancy columns numbering r per group in each of said sets, to replace at least one defective memory column in said network, r being greater than or equal to 1, said r redundancy columns of each said group being connected to a respective one of said amplifiers corresponding to this group.

7. A memory according to claim 6, further comprising a redundancy column selection circuit to select one among said r redundancy columns simultaneously in all said groups of all said sets.

8. A memory according to claim 7 wherein said storage register comprises k groups of memory zones for storing defective memory column addresses, each group of memory zones having r defective memory column addresses, and each defective memory column address enabling one among p memory columns to be designated, each group of memory zones being dedicated to the storage of defective memory column addresses corresponding to only one among said k group order numbers, without any distinction between the sets to which the defective memory columns may belong.

9. A memory according to claim 8 wherein said post-selection circuit is capable of selecting one among said k groups of memory zones during the reception, by the memory, of one among k group addresses.

10. A memory according to claim 3 wherein said post-selection circuit selects one among said k amplifiers simultaneously in each of the sets, as a function of the reception, by the memory of one group address among k group addresses, this group address defining a group order number in each set.

11. A memory according to claim 3, wherein said storage register comprises said groups of memory zones numbering k for storing defective memory column addresses, each group of memory zones having defective memory column addresses numbering r, and each defective memory column address enabling one among said p memory columns to be designated, each said group of memory zones being dedicated to the storage of defective memory column addresses corresponding to only one among said k possible group order numbers, without any distinction between the ones of said sets to which a defective memory column may belong, and wherein said post-selection circuit is capable of selecting one among said k groups of memory zones during the reception, by the memory, of an externally received group address.

12. A memory according to claim 3 wherein said network further comprises redundancy columns numbering r per group in each of said sets, to replace at least one defective memory column in said network, r being greater than or equal to 1, said r redundancy columns of each said group being connected to a respective one of said amplifiers corresponding to this group.

13. A memory according to claim 12, further comprising a redundancy column selection circuit to select one among said r redundancy columns simultaneously in all said groups of all said sets.

14. A memory according to claim 3 wherein said storage register comprises k groups of memory zones for storing defective memory column addresses, each group of memory zones having r defective memory column addresses, and each defective memory column address enabling one among p memory columns to be designated, each group of memory zones being dedicated to the storage of defective memory column addresses corresponding to only one among said k column group order numbers, without any distinction between the sets to which a defective memory column may belong.

15. A memory according to claim 14 wherein said post-selection circuit is capable of selecting one among k groups of memory zones during the reception, by the memory, of one among k group addresses.

16. A memory according to claim 3, wherein said memory further comprises a column decoder to select one among said p memory columns simultaneously in all said groups of all said sets, and a redundancy column selection circuit to select one among r redundancy columns simultaneously in all said groups of all said sets.

17. A memory according to claim 16 wherein said storage register comprises k groups of memory zones for storing defective memory column addresses, each group of memory zones having r defective memory column addresses, and each defective memory column address enabling one among said p memory columns to be designated, each group of memory zones being dedicated to the storage of defective memory column addresses corresponding to only one among said k column group order numbers, without any distinction between the sets to which a defective memory column may belong.

18. A memory according to claim 17 wherein said post-selection circuit is capable of selecting one among k groups of memory zones during the reception, by the memory, of one among k group addresses.

19. A memory according to claim 17 wherein said comparison circuit compares one among p memory column addresses, received by the memory, with all the addresses of a selected group of memory zones and, on the one hand, inhibits the column decoder (but not the post-selection circuit) and, on the other hand, commands the selection, by the redundancy column selection circuit, of a redundancy column determined as a function of the result of the comparison.

20. A memory according to claim 19 wherein said post-selection circuit is capable of selecting one among k groups of memory zones during the reception, by the memory, of one among k group addresses.

21. The integrated circuit of claim 1, wherein said zones of said storage register store bits of data in nonvolatile memory cells.

22. The integrated circuit of claim 1, wherein said zones of said storage register store bits of data in fuses.

23. An integrated circuit memory, comprising:

an array of memory cells organized in rows and columns;

row address logic, connected to receive row address bits and to access at least one row of said array accordingly;

at least one externally accessible data output contact, and, for each said contact, a corresponding set of amplifiers numbering k, each operatively connected and selectable to send data to said contact;

each of said amplifiers being operatively connected to receive data from a respective group of said columns of memory cells numbering p;

each of said amplifiers also being operatively connected to receive data from a respective plurality of redundant columns of said memory cells numbering r;

column decode logic connected to receive column address bits and accordingly to select one of said p columns in each said group;

additional decode logic connected to receive post-selection address bits and accordingly to select one of said k amplifiers for connection to each said data output contact;

redundancy match comparison logic connected to receive said column address bits, but not said post-selection address bits, and to accordingly access a defect memory and, if and only if said defect memory contains a defect record which matches said column address bits, to accordingly provide a corresponding selection of one of r redundant column addresses as output; and column redundancy select logic connected to receive said output of said redundancy match comparison logic, and accordingly to access one of said r redundant columns connected to each of said k amplifiers;

said defect memory containing k memory zones in parallel, and being connected to be driven by said additional decode logic to permit access to only one of said k memory zones by said redundancy match comparison logic; each said memory zone including a set of defect records corresponding to a given respective state of said post-selection address bits.

24. The memory of claim 23, comprising a plurality of z of said contacts, and k•z of said amplifiers, and k•z•p of said columns, and k•z•r of said redundant columns.

25. An integrated circuit memory, comprising:

memory cells organized in rows and columns;

row address logic, connected to receive row address bits and to access at least one row of said cells accordingly;

a plurality of data output contacts numbering z, and, for each said contact, a corresponding set of amplifiers numbering k each operatively connected and selectable to send data to said contact;

each of said amplifiers being operatively connected to receive data from a respective group of said columns of memory cells numbering p;

each of said amplifiers also being operatively connected to receive data from a respective plurality of r redundant columns of said memory cells;

column decode logic connected to receive column address bits and accordingly to select one of said p columns in each said group;

additional decode logic connected to receive post-selection address bits and accordingly to select one of said k amplifiers for connection to each said data output contact;

redundancy match comparison logic connected to receive said column address bits, but not said post-selection address bits, and to accordingly access a defect memory and, if and only if said defect memory contains a defect record which matches said column address bits, to accordingly provide a corresponding selection of one of r redundant column addresses as output; and column redundancy select logic connected to receive said output of said redundancy match comparison logic, and accordingly to access one of said r redundant columns connected to each of said k amplifiers;

said defect memory containing k memory zones in parallel, and being connected to be driven by said additional decode logic to permit access to only one of said k memory zones by said redundancy match comparison logic; each said memory zone including a set of defect records corresponding to a given respective state of said post-selection address bits.

26. A method for operating a multiple-bit-wide integrated circuit memory which includes a plurality of externally accessible data output contacts, a network of memory elements organized into a plurality of groups of memory columns each including at least one redundancy column, and a plurality of k amplifiers connected to each said data output contact, comprising the automatic steps of, in accordance with externally received address data including row address bits, column address bits, and post-selection address bits defining a group order number:

accessing a selected row of memory cells in an array;

selecting, using post-selection circuitry, all the ones of said amplifiers which correspond to the externally received group order number, and also selecting, using the post-selection circuitry, in a defective memory column address storage register comprising k groups of memory zones, one said group which corresponds to the externally received group order number; and comparing each memory column address received by the memory only with column addresses in the selected group of memory zones in said storage register, and selecting a physical column address of said array accordingly.

* * * * *